(12) United States Patent
Park

(10) Patent No.: US 7,476,475 B2
(45) Date of Patent: Jan. 13, 2009

(54) MASK FOR SEQUENTIAL LATERAL SOLIDIFICATION AND METHOD OF PERFORMING SEQUENTIAL LATERAL SOLIDIFICATION USING THE SAME

(75) Inventor: Cheol Ho Park, Yongin-Si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 28 days.

(21) Appl. No.: 11/544,924

(22) Filed: Oct. 5, 2006

(65) Prior Publication Data

US 2007/0264806 A1 Nov. 15, 2007

(30) Foreign Application Priority Data

May 9, 2006 (KR) .................... 10-2006-0041655

(51) Int. Cl.
*G03F 1/00* (2006.01)
(52) U.S. Cl. .......................................... 430/5
(58) Field of Classification Search .............. 430/5, 430/22, 394; 117/4, 89, 92, 95, 97
See application file for complete search history.

(56) References Cited

U.S. PATENT DOCUMENTS

| 6,959,029 | B2 | 10/2005 | Voutsas et al. | |
| 7,223,504 | B2 * | 5/2007 | Lee et al. | 430/5 |
| 7,241,650 | B2 * | 7/2007 | Sun | 438/166 |
| 2005/0079693 | A1 | 4/2005 | Kang et al. | |

FOREIGN PATENT DOCUMENTS

| JP | 2003-151907 | 5/2003 |
| JP | 2003-178978 | 6/2003 |
| JP | 2004-031809 | 1/2004 |
| JP | 2006-013050 | 1/2006 |
| KR | 10-2004-0099736 | 12/2004 |
| KR | 10-2005-0054263 | 6/2005 |
| KR | 10-2005-0065108 | 6/2005 |
| KR | 10-2005-0066573 | 6/2005 |
| KR | 10-2006-0007521 | 1/2006 |
| KR | 10-2006-0010562 | 2/2006 |
| KR | 10-2006-0016421 | 2/2006 |

\* cited by examiner

*Primary Examiner*—Stephen Rosasco
(74) *Attorney, Agent, or Firm*—MacPherson Kwok Chen & Heid LLP

(57) ABSTRACT

Embodiments of a mask for sequential lateral solidification are disclosed herein. In some embodiments, a mask of the present disclosure comprises a transmission region including a first slit column having a plurality of first slits separated from one another by a predetermined interval, and a second slit column having a plurality of second slits separated from one another by a predetermined interval and disposed adjacent to and offset from the first slit column. An irradiated laser beam is substantially completely transmitted through the transmission region. In some embodiments, the mask includes a semi-transmission region including a first opening pattern disposed at least partially between adjacent first slits and having a plurality of first openings formed into a desired shape, and a second opening pattern disposed at least partially between adjacent second slits and having a plurality of second opening formed into a desired shape. A portion of less than all of the laser beam is transmitted through the semi-transmission region. A method of performing the sequential lateral solidification using the mask is also disclosed herein.

23 Claims, 11 Drawing Sheets
(3 of 11 Drawing Sheet(s) Filed in Color)

MASK FOR SEQUENTIAL LATERAL SOLIDIFICATION AND METHOD OF PERFORMING SEQUENTIAL LATERAL SOLIDIFICATION USING THE SAME

CROSS-REFERENCE TO RELATED APPLICATION

This application claims priority to and the benefit of Korean Patent Application No. 10-2006-0041655, filed in the Korean Intellectual Property Office on May 9, 2006, the entire contents of which are incorporated herein by reference.

BACKGROUND OF THE INVENTION

1. Field of the Invention

The present invention relates to a mask for sequential lateral solidification and a method of performing sequential lateral solidification using the same. More specifically, the present invention relates to a mask that may be used for sequential lateral solidification and a method of performing sequential lateral solidification using the same. The method may result in a material in which crystal defects are reduced or eliminated, and which can induce the growth of larger crystal grains.

2. Description of the Related Art

Among crystallization techniques for transforming amorphous silicon into polysilicon, sequential lateral solidification (SLS) is an important technique. SLS may be used for fabricating a high performance thin film transistors, due to its ability to obtain larger silicon grains, compared with the other crystallization techniques. According to such a sequential lateral solidification technique, a laser beam passes through a mask formed with a slit, to crystallize amorphous silicon. That is, if the amorphous silicon is irradiated by the laser through the mask slit, the amorphous silicon irradiated with the laser beam is completely melted and then solidified, resulting in crystal growth. During solidification, the crystal grains grow from both edges (of the region on which the laser beam is irradiated) laterally toward the center of the amorphous silicon, and the growth stops at a central portion where the grains meet each other.

FIG. 1A is a schematic plan view of a conventional mask for sequential lateral solidification. Referring to FIG. 1A, the mask 5 is composed of a first slit column 3 which includes a plurality of first slits 1 arranged at regular intervals, and a second slit column 4 which includes a plurality of second slits 2 arranged at regular intervals, and which is disposed adjacent to and offset from the first slit column 3. FIG. 1B shows the intensity distribution of a laser beam transmitted through the mask of FIG. 1A. Each of the first and second slits 1 and 2 is a transmission region where the laser beam is completely transmitted, whereas the remaining area is a non-transmission region where the laser beam is not transmitted. FIG. 1C shows a simulation of polysilicon grains grown using a mask such as mask 5 of FIG. 1A.

FIG. 2A schematically illustrates a scanning pattern according to stage movement of a sequential lateral solidification apparatus, and FIG. 2B is a photograph showing a conventional polysilicon thin film in which a line-overlap defect occurred.

Referring to FIG. 2A, a stage on which a substrate is placed causes a shot-to-shot offset in a scanning direction depending on the speed at which the stage moves. Shot-to-shot offset is generally caused by a combination of rolling, pitching, yawing and optical abnormality, which in turn are caused by properties inherent to the stage, when the stage moves straight. If such a shot-to-shot offset occurs, the size of overlap between lines where the laser beam transmits and crystal growth occurs may be changed. In a case such as that shown in FIG. 1C, where the spacing between the lines is large, a line-overlap defect may occur, as shown in FIG. 2B. As a result, degradation occurs in the area where the overlap defect is produced, which can lead to a defective pixel and thus to a defective image.

SUMMARY OF THE INVENTION

Embodiments of the present invention address the aforementioned problems in the prior alt. A feature of the present invention is to provide a mask for sequential lateral solidification and a method of performing sequential lateral solidification using the same, in which overlap between lines is improved to compensate for the reduced overlap due to the stage vibration and the like. The resultant mask may provide increased process margin, and may induce growth of larger crystal grains.

According to an aspect of the present invention, there is provided a mask for sequential lateral solidification, which comprises a transmission region and a semi-transmission region. The transmission region includes one or more features to transmit substantially all incident light. The semi-transmission region is positioned proximate the transmission region and is configured to transmit a portion less than all of the light incident on the semi-transmission region.

For example, the transmission region may include a first slit column having a plurality of first slits separated from one another by a predetermined interval, and a second slit column having a plurality of second slits separated from one another by a predetermined interval and disposed adjacent to and offset from the first slit column, wherein irradiated laser beam is completely transmitted through the transmission region. The semi-transmission region may include a first opening pattern disposed between the plurality of first slits and having a plurality of first openings formed into a desired shape, and a second opening pattern disposed between the plurality of second slits and having a plurality of second opening formed into a desired shape, wherein a portion less than all of the laser beam is transmitted through the semi-transmission region.

Preferably, the first and second slits are arranged at a predetermined angle with respect to a scanning direction, and the first and second openings are arranged at the predetermined angle with respect to the scanning direction.

Preferably, the semi-transmission region is configured such that only about 30% to about 95% of the laser beam is transmitted therethrough.

Preferably, the first opening pattern includes a plurality of first openings formed into a line slit shape, and the second opening pattern includes a plurality of second openings formed into a line slit shape.

Preferably, one or more first openings are disposed at least partially in each area between adjacent first slits and separated from one another by a predetermined interval, and one or more second openings are disposed at least partially in each area between adjacent second slits and separated from one another by a predetermined interval.

Preferably, one or more first openings are disposed adjacent upper and lower ends of the first slit column and separated from one another by a predetermined interval, and one or more second openings are disposed adjacent upper and lower ends of the second slit column and separated from one another by a predetermined interval.

Preferably, the first opening pattern includes a plurality of first openings formed into a rectangular slit shape corresponding to an outer peripheral shape of the first slit, and the second opening pattern includes a plurality of second openings formed into a rectangular slit shape corresponding to an outer peripheral shape of the second slit.

Preferably, one or more first openings are disposed around each of the first slits and separated from one another by a predetermined distance, and one or more second openings are disposed around each of the second slits and separated from one another by a predetermined distance.

Preferably, the first opening pattern further includes a first opening formed into a rectangular slit shape corresponding to an outer peripheral shape of the first slit column, and the second opening pattern further includes a second opening formed into a rectangular slit shape corresponding to an outer peripheral shape of the second slit column.

Preferably, the first opening pattern includes a plurality of first openings formed into a dot slit shape, and the second opening pattern includes a plurality of second openings formed into a dot slit shape.

Preferably, the plurality of first openings are at least partially disposed in each area between adjacent first slits and separated from one another by a predetermined interval, and the plurality of second openings are at least partially disposed in each area between adjacent second slits and separated from one another by a predetermined interval.

Preferably, each of the first openings is formed to have a width less than a spacing between the first slits and each of the second openings is formed to have a width less than a spacing between the second slits.

Preferably, each of the first openings is formed to have substantially the same width as a spacing between the first slits, and each of the second openings is formed to have substantially the same width as a spacing between the second slits.

Preferably, each of the first openings is formed into a circular or polygonal dot slit shape and each of the second openings is formed into a circular or polygonal dot slit shape.

Preferably, each of the first slits is formed to have a width larger than a spacing between the first slits and each of the second slits is formed to have a width larger than a spacing between the second slits.

According to another aspect of the present invention, there is provided a mask for sequential lateral solidification, which comprises a transmission region including a slit column having a plurality of slits separated from one another by a predetermined interval, wherein incident light is completely transmitted therethrough; and a semi-transmission region including an opening pattern having a plurality of openings formed into a predetermined shape and disposed at least partially in each area between adjacent ones of the plurality of slits, wherein a portion less than all of the incident light is transmitted therethrough.

Preferably, each of the slits is positioned at a predetermined angle with respect to a scanning direction, and each of the openings is positioned at the predetermined angle with respect to the scanning direction.

Preferably, the semi-transmission region is configured such that only about 30% to about 95% of the laser beam is transmitted therethrough.

According to a further aspect of the present invention, there is provided a method of performing sequential lateral solidification, comprising providing a mask for sequential lateral solidification; arranging and aligning the mask with respect to a substrate on which an amorphous silicon thin film is formed; irradiating light on a first region of the substrate through the mask; and moving the substrate in a predetermined direction and then irradiating the laser beam on the substrate through the mask. The mask may comprise a transmission region including a first slit column comprising a plurality of slits spaced apart from one another by a predetermined interval and a second slit column comprising a plurality of second slits spaced apart from one another by a predetermined interval and disposed adjacent to and offset from the first slit column. The transmission region is configured so light incident on the transmission region is substantially completely transmitted therethrough. The mask may further comprise a semi-transmission region including a first opening pattern comprising at least one first opening disposed at least partially between adjacent ones of the plurality of first slits, the semi-transmission region further including a second opening pattern comprising at least one second opening disposed at least partially between adjacent ones of the plurality of second slits, and wherein the semi-transmission region is configured to transmit a portion less than all of light incident on the semi-transmission region.

In general, in another aspect, a method comprises providing a mask for sequential lateral solidification and arranging and aligning the mask with respect to a substrate on which an amorphous silicon thin film is formed. The method may further comprise irradiating laser light on a first region of the substrate through the mask, and moving the substrate in a predetermined direction and subsequently irradiating the laser light on a second different region of the substrate through the mask.

The mask may comprise a transmission region comprising a plurality of slits configured to transmit substantially all laser light incident on the transmission region, and a semi-transmission region positioned adjacent the transmission region, the semi-transmission region configured to transmit a portion less than all of the laser light incident on the semi-transmission region.

BRIEF DESCRIPTION OF THE DRAWINGS

The patent or application file contains at least one drawing executed in color. Copies of this patent or patent application publication with color drawings will be provided by the U.S. Patent and Trademark Office upon request and payment of the necessary fee.

The above and other features and advantages of the present invention will become apparent from the following description of preferred embodiments given in conjunction with the accompanying drawings, in which.

DETAILED DESCRIPTION OF THE INVENTION

Hereinafter, preferred embodiments of the present invention will be described in detail with reference to the accompanying drawings.

Figure 1A:
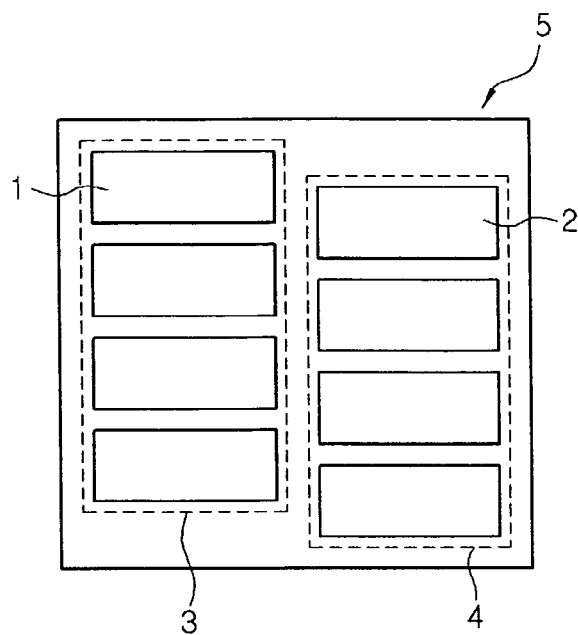
FIG. 1A is a schematic plan view of a conventional mask for sequential lateral solidification.
Figure 1B:
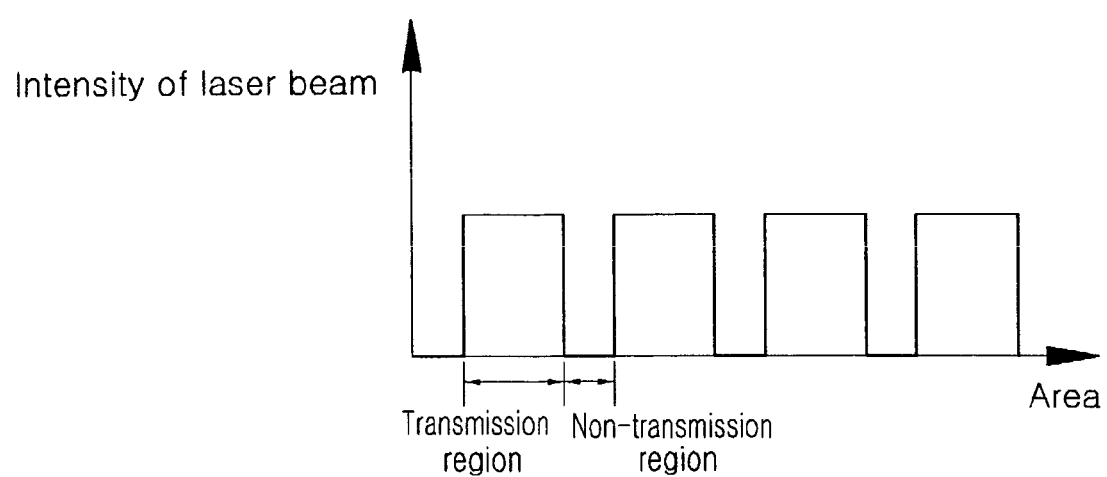
FIG. 1B shows the intensity distribution of a laser beam transmitted through the mask of FIG. 1A.
Figure 1C:
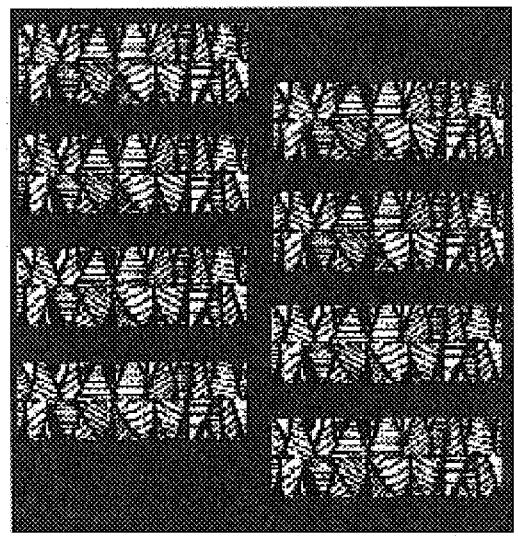
FIG. 1C shows polysilicon grains grown using the mask of FIG. 1A.
Figure 2A:
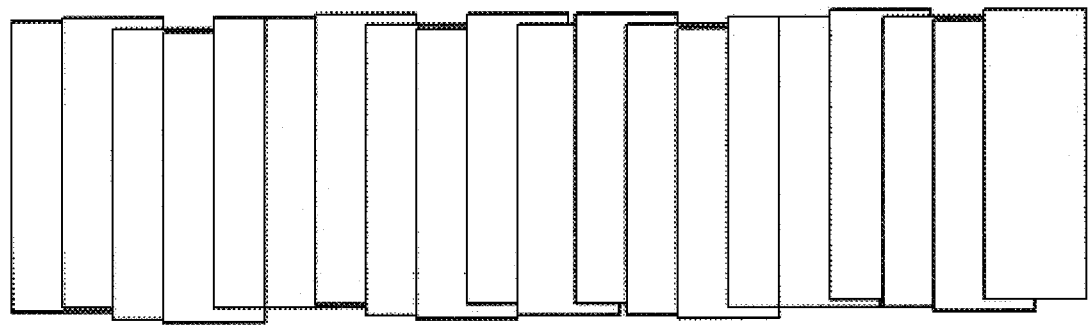
FIG. 2A schematically illustrates a scanning pattern according to stage movement of a sequential lateral solidification apparatus.
Figure 2B:
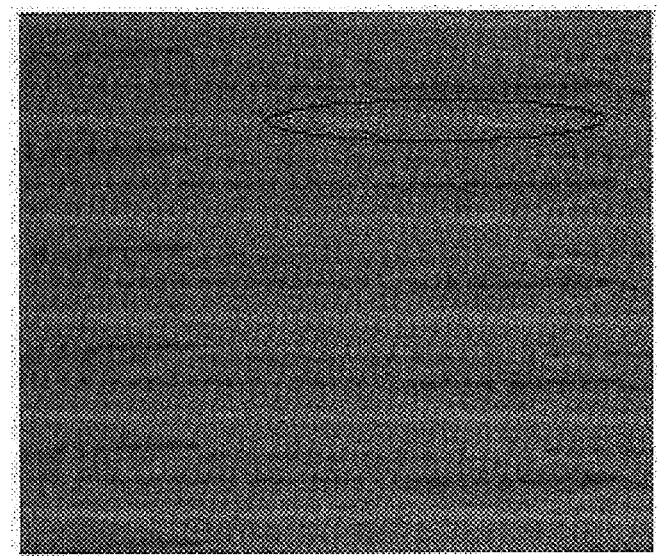
FIG. 2B is a photograph showing a conventional polysilicon thin film in which a line-overlap defect occurred.
Figure 3:
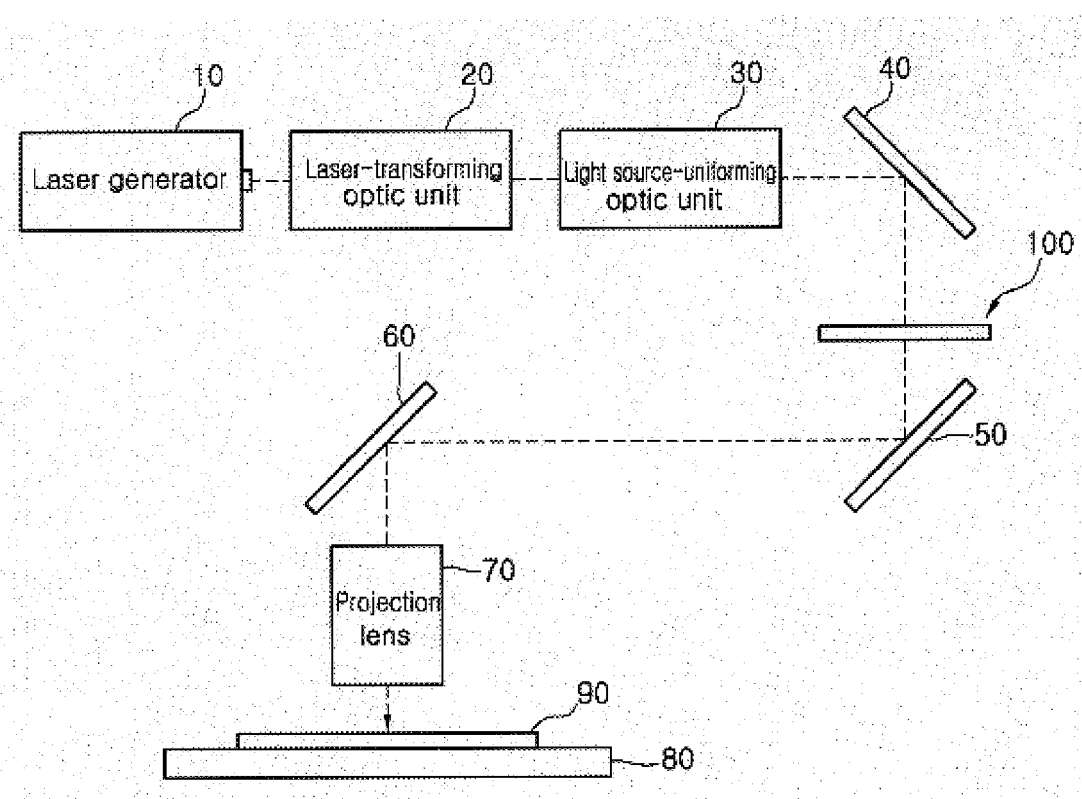
FIG. 3 is a schematic diagram illustrating the configuration of a sequential lateral solidification apparatus according to the present invention.

FIG. 3 is a schematic diagram illustrating the configuration of a sequential lateral solidification apparatus according to embodiments of the present invention.

Referring to FIG. 3, the sequential lateral solidification apparatus comprises a laser generator 10, a laser-transforming optic unit 20, a light source-uniforming optic unit 30, a first reflection mirror 40, a second reflection mirror 50, a third reflection mirror 60, a projection lens 70, a stage 80, and a mask 100 including transmission and semi-transmission regions.

The laser generator 10 generates a pulsed laser with a frequency of about 300 Hz. The laser-transforming optic unit 20 maintains a pulse generated from the laser generator 10 for a certain period of time. The light source-uniforming optic unit 30 maintains the uniformity of laser beam at a constant level. The laser beam output from the light source-uniforming optic unit 30 is reflected by the first reflection mirror 40 and passes through one or more transmission regions of the mask 100. Then, the laser beam is sequentially reflected by means of the second and third reflection mirrors 50 and 60, and is incident on the projection lens 70. The area of the laser beam incident on the projection lens 70 is reduced to a certain ratio of its size as incident on substrate(90), e.g. 1/5 in this embodiment of the present invention, to thereby completely melt a localized area of amorphous silicon. The melted portion is cooled and crystallized in such a manner that the growth starts from a surrounding unmelted region and then stops at the center where the growing grains meet each other.

Here, the mask 100 includes a transmission region through which the laser beam is completely transmitted and a semi-transmission region through which only a portion of the laser beam, preferably about 30% to about 95% of the total of the incident laser beam, is transmitted. Thus, the mask 100 of the present disclosure can be used to induce larger grain growth, compared to a conventional mask which is used to crystallize polysilicon and which includes only the transmission and non-transmission regions. Hereinafter, the shape and structure of embodiments of mask 100 will be explained in detail.

Figure 4:
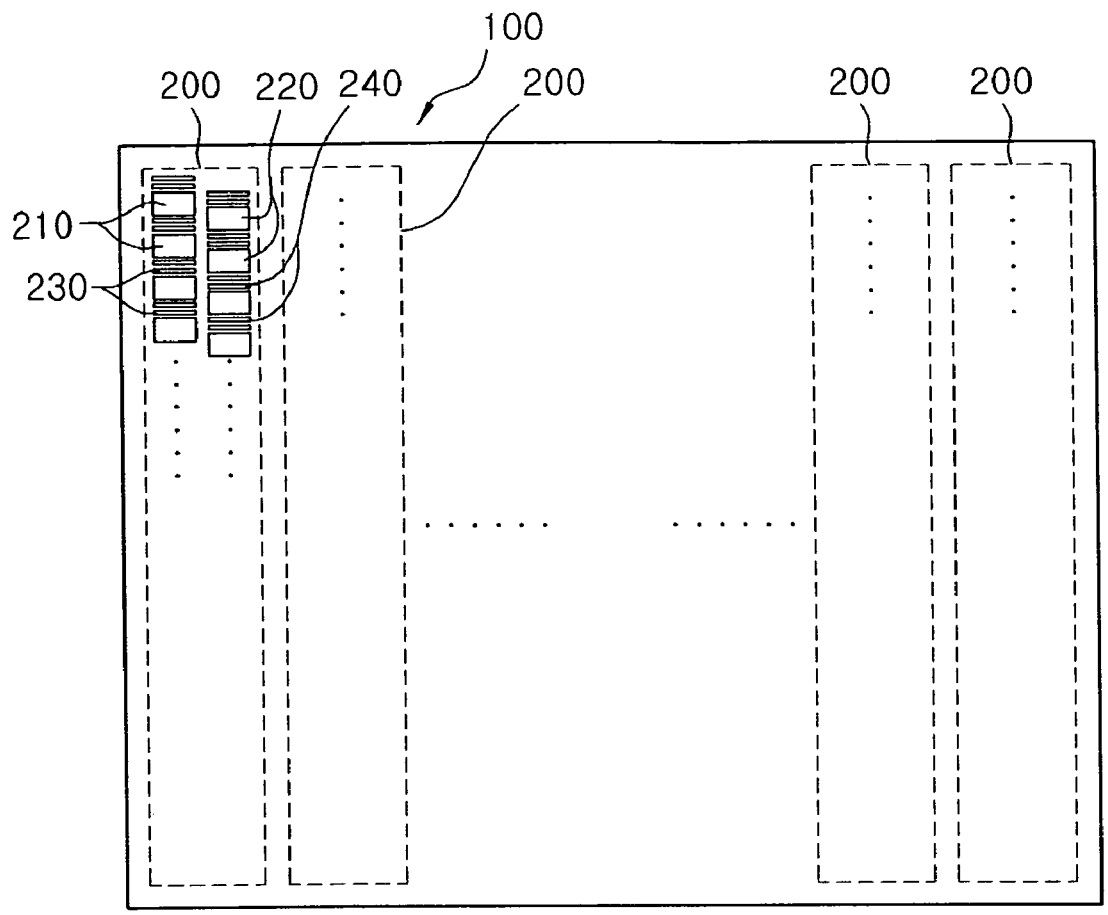
FIG. 4 is a schematic plan view of a mask for sequential lateral solidification according to a first embodiment of the present invention.
Figure 5:
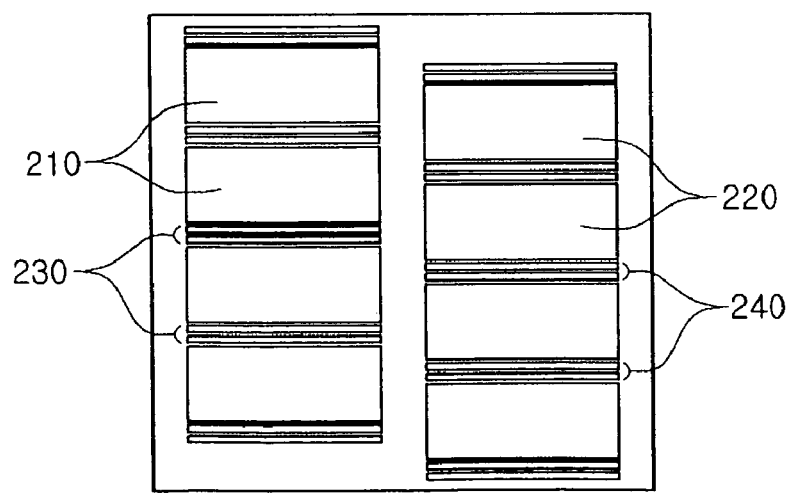
FIG. 5 is a partially enlarged plan view of the mask for sequential lateral solidification according to the first embodiment of the present invention.

FIG. 4 is a schematic plan view of a mask for sequential lateral solidification according to a first embodiment of the invention, and FIG. 5 is a partially enlarged plan view of the mask for sequential lateral solidification according to the first embodiment of the invention.

Referring to FIGS. 4 and 5, the mask 100 includes a plurality of unit masks 200. Each of the unit masks 200 includes a first slit column having a plurality of first slits 210 separated from one another by a predetermined interval and a second slit column having a plurality of second slits 220 separated from one another by a predetermined interval. In the example shown here, the second slit column has the same configuration as the first slit column and is disposed adjacent to and offset from the first slit column.

In addition, disposed in each area between adjacent first slits 210 is a first opening pattern which includes a plurality of first openings 230 formed into a line slit shape. Disposed in each area between adjacent second slits 220 is a second opening pattern which includes a plurality of second openings 240 formed into a line slit shape. In this embodiment, the width of the first slit 210 may be formed to be larger than the spacing between adjacent first slits, and the width of the second slit 210 may be formed to be larger than the spacing between adjacent second slits.

Each of the first and second slit columns, which are composed respectively of the plurality of first slits 210 and the plurality of second slits 220, defines a transmission region through which the incident laser beam is completely transmitted. Each of the first and second opening patterns, which are composed respectively of the plurality of first openings 230 and the plurality of second openings 240, defines a semi-transmission region through which a portion of the incident laser beam is transmitted. For this embodiment, the semi-transmission region is preferably designed such that only about 30% to about 95% of the incident laser beam intensity can be transmitted through the semi-transmission region. The reason for including semi-transmission regions including the first and second opening patterns is that the first and second openings 230 and 240 can adjust an amount of incident laser beam intensity to be transmitted therethrough. They are able to achieve this effect because the plurality of first openings 230 and second openings 240 are formed to have much smaller widths than the first slits 210 and the second slits 220.

One or more first openings 230 may be disposed in each area between adjacent first slits 210 in a configuration where the first openings are separated from one another, while one or more second openings 240 may be disposed in each area between adjacent second slits 220 in a configuration where the second openings are separated from one another. In this embodiment, the illustrated example has two first openings 230 disposed in each area between adjacent first slits, and has two second openings 240 disposed in each area between adjacent second slits.

Furthermore, one or more first openings may be disposed in areas outside of the distal first slits 210 in the first slit column, i.e. at upper and lower ends of the first slit column, in a configuration where the first openings 230 are separated from one another. Similarly, one or more second openings 240 may be disposed at areas outside of the distal second slits 220 in the second slit column, i.e. at upper and lower ends of the second slit column, in a configuration where the second openings 240 are separated from one another.

Figure 6A:
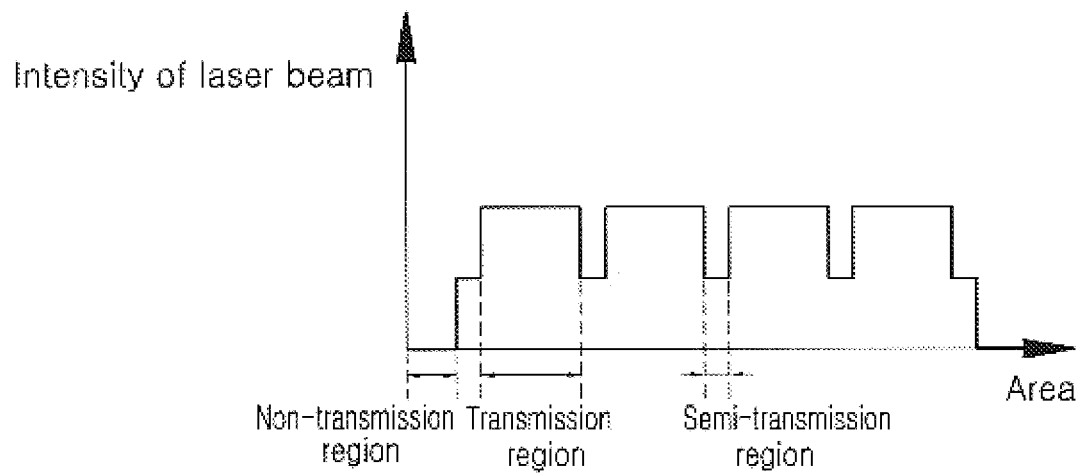
FIG. 6A shows the intensity distribution of laser beam transmitted through the mask for sequential lateral solidification of FIG. 5.
Figure 6B:
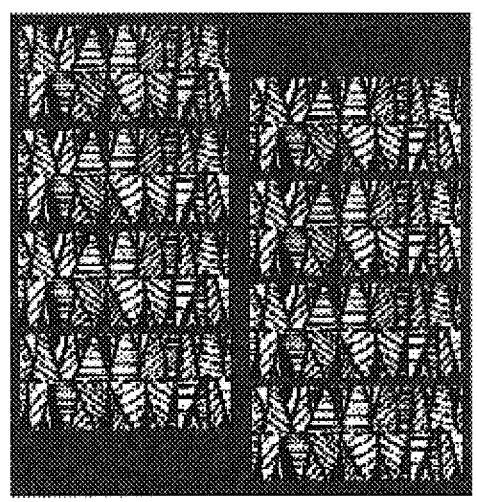
FIG. 6B shows polysilicon grains grown using the mask for sequential lateral solidification of FIG. 5.

FIG. 6A shows the intensity distribution of laser beam transmitted through the mask for sequential lateral solidification of FIG. 5, and FIG. 6B shows a simulation of polysilicon grains grown using the mask for sequential lateral solidification of FIG. 5.

Referring to FIGS. 5 and 6A, each of the first slit column and the second slit column, which are composed respectively of the plurality of first slits 210 and the plurality of second slits 220, defines the transmission region through which the incident laser beam is completely transmitted and projected on a region of a substrate, to thereby completely melt amorphous silicon. The melted portion is then solidified and crystallized. Each of the first and second opening patterns, which are composed respectively of the plurality of first openings 230 and the plurality of second openings 240, defines the semi-transmission region through which only a portion of the incident laser beam is transmitted and projected on the substrate to thereby melt or heat a portion of the amorphous silicon. This facilitates the crystallization occurring in the transmission region and thus can induce the growth of larger crystal grains.

FIG. 6B shows polysilicon grains grown using the mask for sequential lateral solidification of FIG. 5. It can be seen from this figure that the size of the polysilicon grains is larger than the widths of the first slit 210 and the second slit 220. That is, the grain growth has occurred in not only the transmission region but also the semi-transmission region in the neighborhood of the transmission region.

Figure 7:
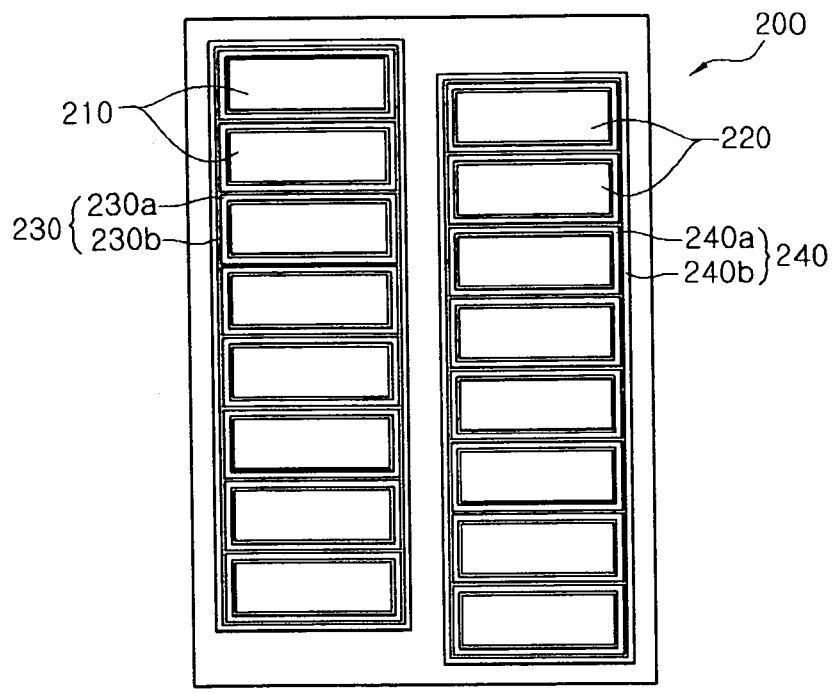
FIG. 7 is an enlarged plan view of a mask for sequential lateral solidification according to a second embodiment of the present invention.

FIG. 7 is an enlarged plan view of a mask for sequential lateral solidification according to a second embodiment of the present invention. The mask of the second embodiment is different from that of the first embodiment, in that the first and second openings of the first and second opening patterns are have different shapes than the first and second openings shown in FIG. 5. The other aspects of the mask are similar to those of the mask of FIG. 5, and thus, the following explanation will be focused on the different aspect.

Referring to FIG. 7, each of the unit masks 200 includes a first slit column having a plurality of first slits 210 separated from one another by a predetermined interval, and a second slit column having a plurality of second slits 220 separated from one another by a predetermined interval. In the embodiment shown in FIG. 7, the second slit column has the same configuration as the first slit column and is disposed adjacent to and offset from the first slit column.

Further, disposed around the first slits 210 is a first opening pattern which includes a plurality of first openings 230a formed into a rectangular slit shape corresponding to an outer peripheral shape of each first slit 210, and a first opening 230b formed into a rectangular slit shape corresponding to the outer peripheral shape of the first slit column. That is, each of the first openings 230a is formed along the outer periphery of each first slit 210 and is separated from the outer periphery by a predetermined distance. The first opening 230b is formed along the outer periphery of the plurality of first openings 230a in such a way to include the first openings 230a therein. In this embodiment, a single first opening 230a is formed around each first slit 210 and a single first opening 230b is formed around the first slit column. However, the number of the first openings 230a and 230b is not limited thereto, and need not be the same.

Furthermore, disposed around the second slits 220 is a second opening pattern which includes a plurality of second openings 240a formed into a rectangular slit shape corresponding to the outer peripheral shape of each second slit 220, and a second opening 240b formed into a rectangular slit shape corresponding to the outer peripheral shape of the second slit column. That is, each of the second openings 240a is formed along the outer periphery of each second slit 220 and is separated from the outer periphery by a predetermined distance. The second opening 240b is formed along the outer periphery of the plurality of second openings 240a in such a way to include the second openings 240a therein. In this embodiment, a single second opening 240a is formed around each second slit 220 and a single second opening 240b is formed around the second slit column. However, the number of the second openings 240a and 240b is not limited thereto, and need not be the same.

Since the opening pattern formed to surround each slit serves as a semi-transmission region through which a portion of laser beam can be transmitted, the silicon crystal growth occurring mainly in the transmission region can be increased and facilitated.

Figure 8A:
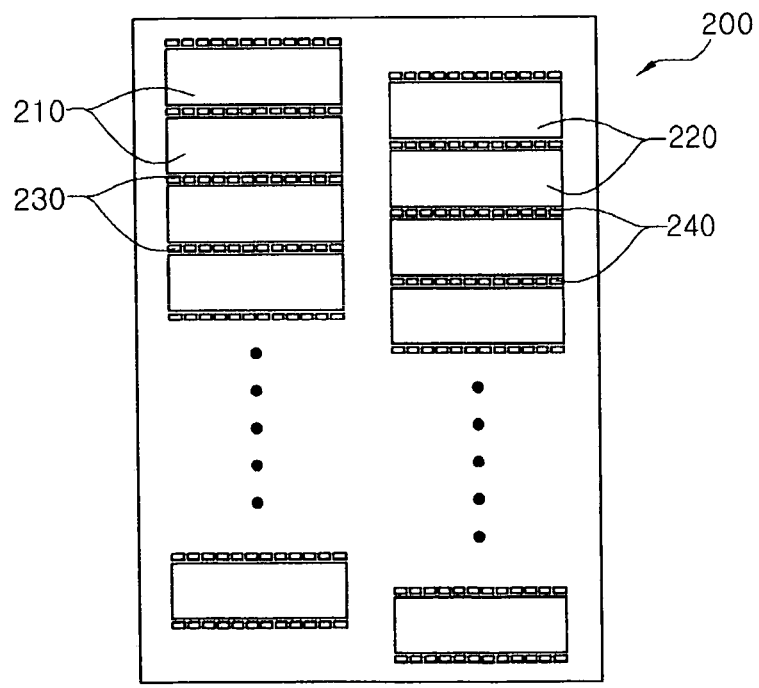
FIG. 8A is an enlarged plan view of a mask for sequential lateral solidification according to a third embodiment of the present invention.
Figure 8B:
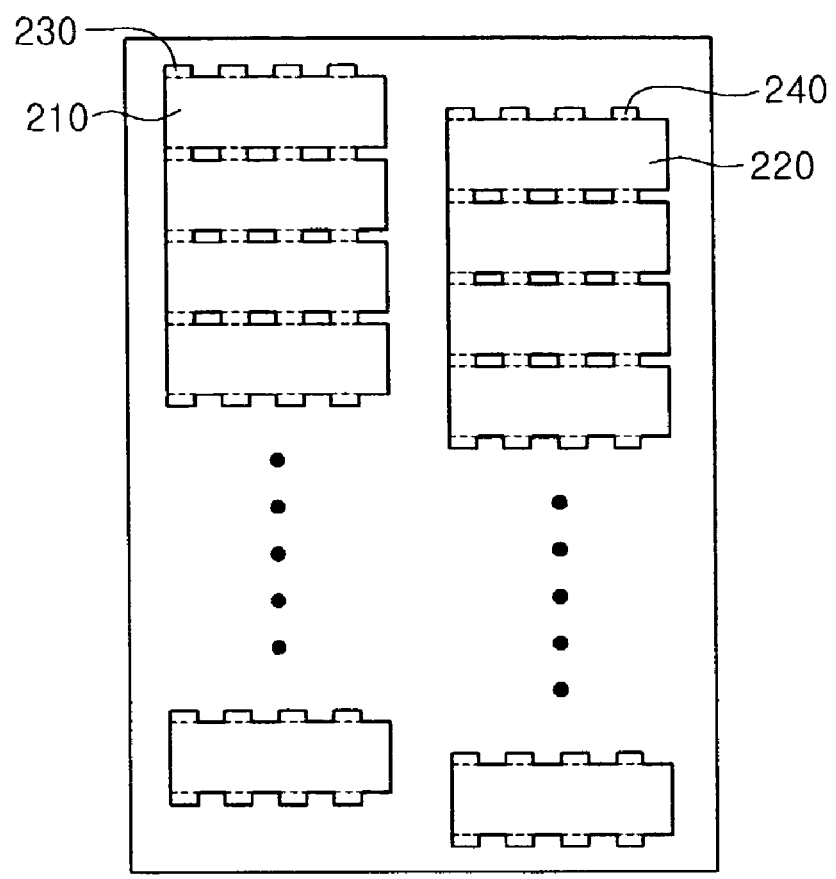
FIG. 8B is an enlarged plan view of a mask for sequential lateral solidification according to a fourth embodiment of the present invention.

FIG. 8A is an enlarged plan view of a mask for sequential lateral solidification according to a third embodiment of the present invention, and FIG. 8B is an enlarged plan view of a mask for sequential lateral solidification according to a fourth embodiment of the invention.

Referring to FIG. 8A, each of the unit masks 200 includes a first slit column having a plurality of first slits 210 separated from one another by a predetermined interval, and further includes a second slit column having a plurality of second silts 220 separated from one another by a predetermined interval. In the example of FIG. 8A, the second slit column has the same configuration as the first slit column and is disposed adjacent to and offset from the first slit column.

In addition, disposed at each area between the first slits 210 is a first opening pattern including a plurality of first openings 230 formed into a dot slit shape. Disposed at each area between the second slits 220 is a second opening pattern including a plurality of second openings 240 formed into a dot slit shape. The plurality of first openings 230 are disposed in each area between adjacent first slits 210 such that they are separated from one another by a predetermined interval. The plurality of second openings 240 are also disposed in each area between adjacent second slits 220 such that they are separated from one another by a predetermined interval.

Each of the first openings 230 is formed to have a width less than the spacing between the first slits 210. Each of the second openings 240 is also formed to have a width less than the spacing between the second slits 220. In the illustrated embodiment, the first and second openings 230 and 240 formed into dot slit shapes are disposed in a single row in each area between adjacent first slits 210 and in each area between adjacent second slits 220, respectively. However, the present invention is not limited thereto. For example, the openings may be disposed in two or more rows in each area between adjacent slits.

The mask according to the fourth embodiment shown in FIG. 8B is different from that of the third embodiment, in that each of the first openings 230 is formed to have a width equal to the spacing between the first slits 210 and each of the second openings 240 is also formed to have a width equal to the spacing between the second slits 220. The other aspects are similar to each other.

Alternatively, in the masks according to the third and fourth embodiment of the present invention, the plurality of first openings 230 may be formed into various dot shapes such as dot slit shapes that are at least partially curved (e.g., circular), or polygonal dot slit shapes. The plurality of second openings 240 may also be formed into various dot shapes such as dot slit shapes that are at least partially curved (e.g., circular), or polygonal dot slit shapes. In an embodiment where the dot slit is formed into a rectangular shape, rectangular grain growth can be induced, and problems related to crystallization strain that may occur when performing sequential lateral solidification can be reduced.

Figure 9A:
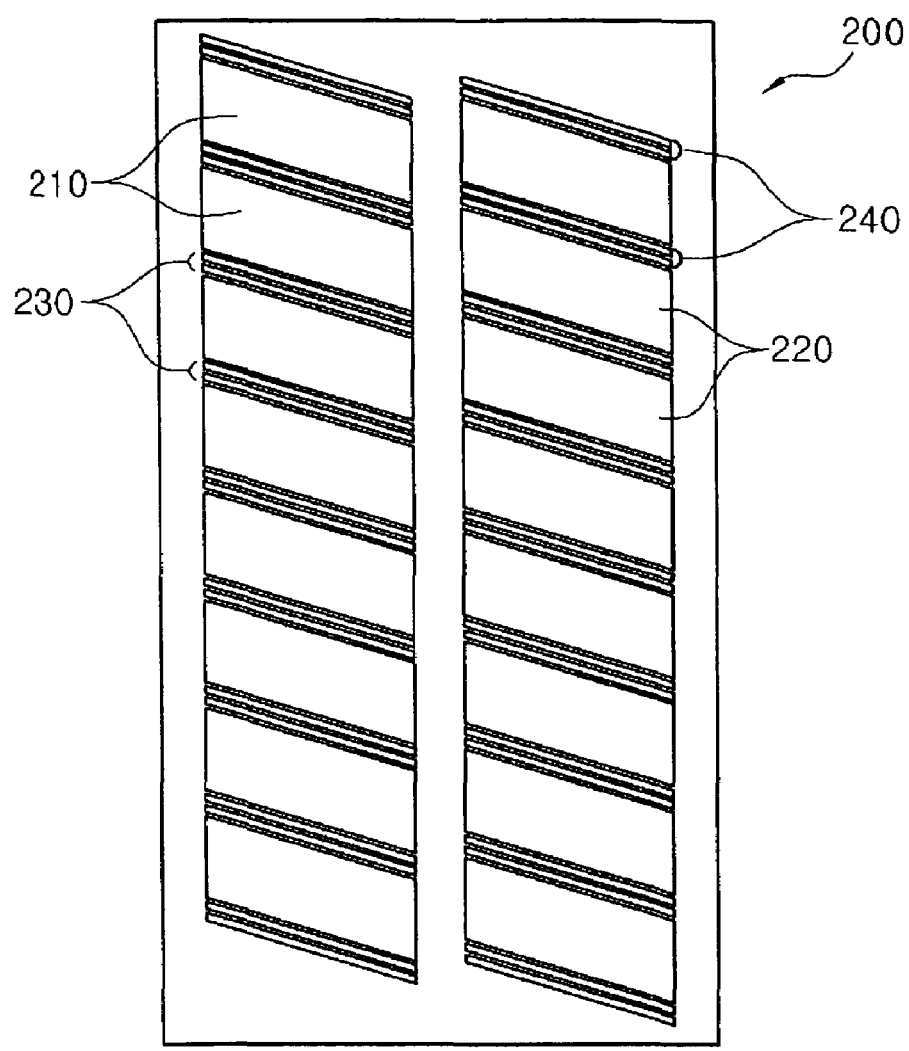
FIGS. 9A to 9C are enlarged plan views of a mask for sequential lateral solidification according to fifth to seventh embodiments of the present invention.
Figure 9B:
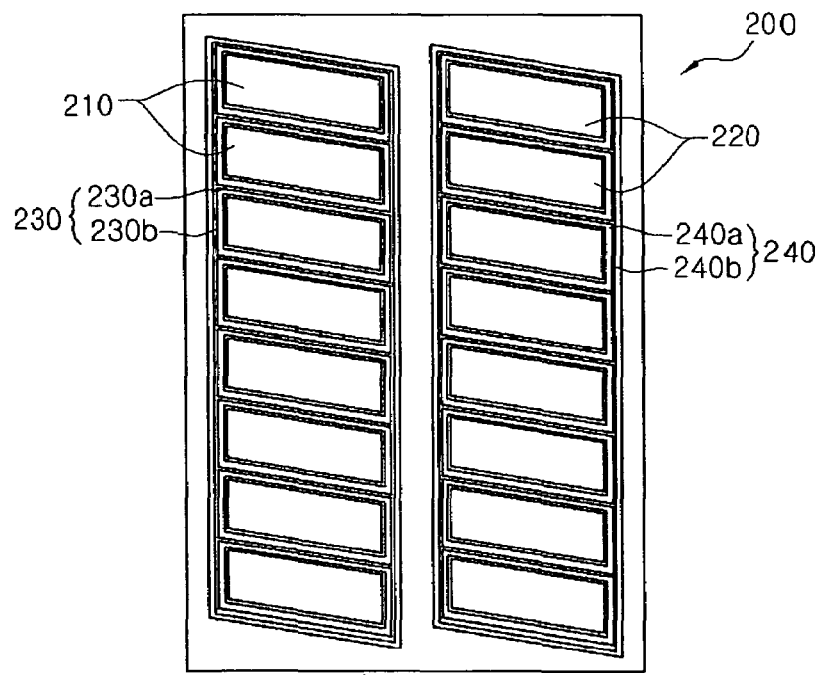
Figure 9C:
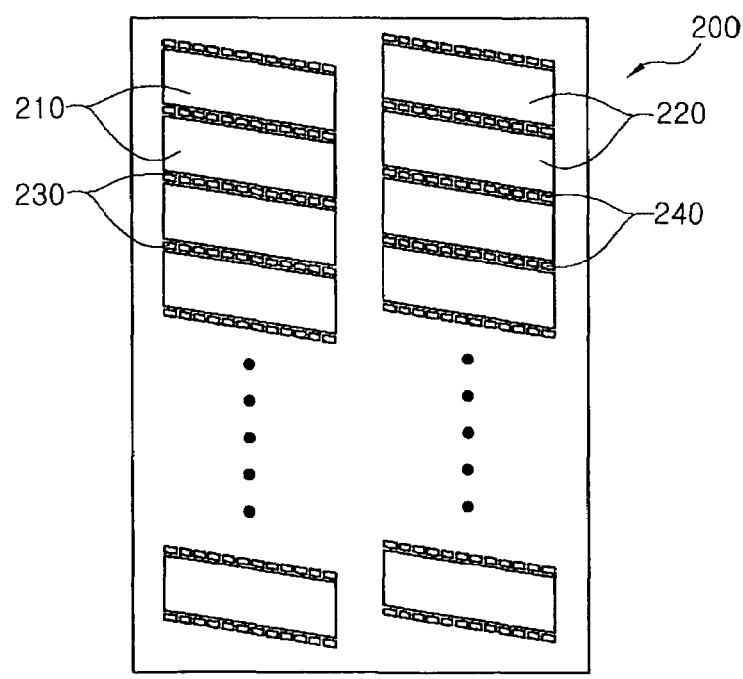

FIGS. 9A to 9C are enlarged plan views of a mask for sequential lateral solidification according to fifth to seventh embodiments of the present invention.

The mask according to the fifth embodiment shown in FIG. 9A is different from that of the first embodiment, in that the plurality of first slits 210 and the plurality of second slits 220 are arranged to be inclined at a certain angle. The other illustrated aspects are similar to each other, and thus, the following explanation will be focused on the different aspects.

Referring to FIG. 9A, each of the unit masks 200 includes a first slit column having a plurality of first slits 210 separated from one another by a predetermined interval and a second slit column having a plurality of second slits 220 separated from one another by a predetermined interval. In the embodiment of FIG. 9A, the second slit column has the same configuration as the first slit column, and is disposed adjacent to and offset from the first slit column. Disposed at each area between adjacent first slits 210 is a first opening pattern including a plurality of first openings 230 formed into a line slit shape. Disposed in each area between adjacent second slits 220 is a second opening pattern including a plurality of second openings 240 formed into a line slit shape.

In addition, each of the first and second slits 210 and 220 is disposed to be inclined at a predetermined angle with respect to a scanning direction, and each of the first and second openings 230 and 240 is also disposed to be inclined at the predetermined angle with respect to a scanning direction, in the same way as the first and second slits 210 and 220. That is, the slits and/or openings may be inclined at an angle that is neither parallel to or perpendicular to the scanning direction associated with the mask.

The mask according to the sixth embodiment shown in FIG. 9B is similar to the second embodiment, but differs in that the plurality of first slits 210 and the plurality of second slits 220 are disposed to be inclined at a predetermined angle. The other aspects of the mask are similar to those of the second embodiment, and thus, the following explanation will be focused on the different aspects.

Referring to FIG. 9B, each of the unit masks 200 includes a first slit column having a plurality of first slits 210 separated from one another by a predetermined interval, and also includes a second slit column having a plurality of second slits 220 separated from one another by a predetermined interval. In the embodiment of FIG. 9B, the second slit column has the same configuration as the first slit column and is disposed adjacent to and offset from the first slit column. Disposed around the first slits 210 is a first opening pattern including a plurality of first openings 230a formed into a rectangular slit shape corresponding to the outer peripheral shape of each first slit 210, and a first opening 230b formed into a rectangular slit shape corresponding to the outer peripheral shape of the first slit column. Disposed around the second slits 220 is a second opening pattern including a plurality of second openings 240a formed in a rectangular slit form corresponding to the peripheral outline of each second slit 220 and a second opening 240b formed in a rectangular slit form corresponding to the peripheral outline of the second slit column.

In addition, each of the first and second slits 210 and 220 is arranged to be inclined at a predetermined angle with respect to a scanning direction. Each of the first openings 230a and 230b and each of the second openings 240a and 240b are also arranged to be inclined at the predetermined angle with respect to the scanning direction, in the same way as the first and second slits.

The mask according to the seventh embodiment shown in FIG. 9C is different from that of the third embodiment in that the plurality of first slits 210 and the plurality of second slits 220 are disposed to be inclined at a predetermined angle. The other aspects are similar to each other, and thus, the following explanation will be focused on the different aspects.

Referring to FIG. 9C, each of the unit masks 200 includes a first slit column having a plurality of first slits 210 separated from one another by a predetermined interval, and further includes a second slit column having a plurality of second slits 220 separated from one another by a predetermined interval. In the example illustrated in FIG. 9C, the second slit column has the same configuration as the first slit column and is disposed adjacent to and offset from the first slit column. Disposed at each area between adjacent first slits 210 is a first opening pattern including a plurality of first openings 230 formed into a dot slit shape. Disposed at each area between adjacent second slits 220 is a second opening pattern including a plurality of second openings 240 formed into a dot slit shape.

In addition, each of the first and second slits 210 and 220 is arranged to be inclined at a predetermined angle with respect to a scanning direction. Further, each of the first and second openings 230 and 240 is arranged to be inclined at the predetermined angle with respect to the scanning direction, in the same way as the first and second slits.

Since the first and second slit columns and the first and second opening patterns are arranged to be inclined at a certain angle, the crystal grain can be grown in an inclined direction.

Figure 10A:
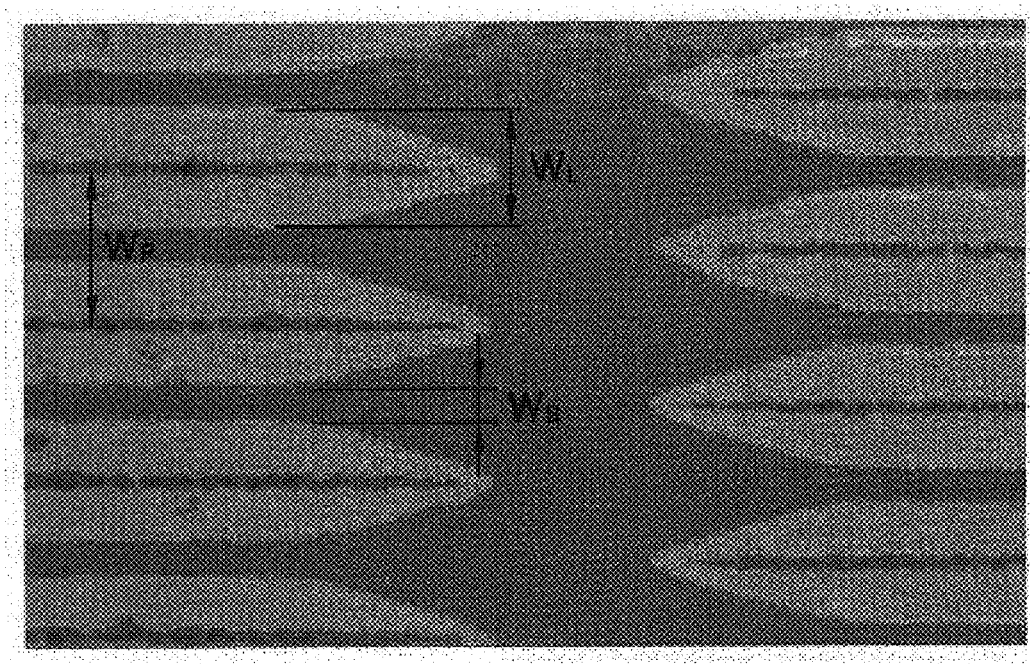
FIGS. 10A to 10C are photographs showing polysilicon grains grown using the masks according to a prior art and the present invention.
Figure 10B:
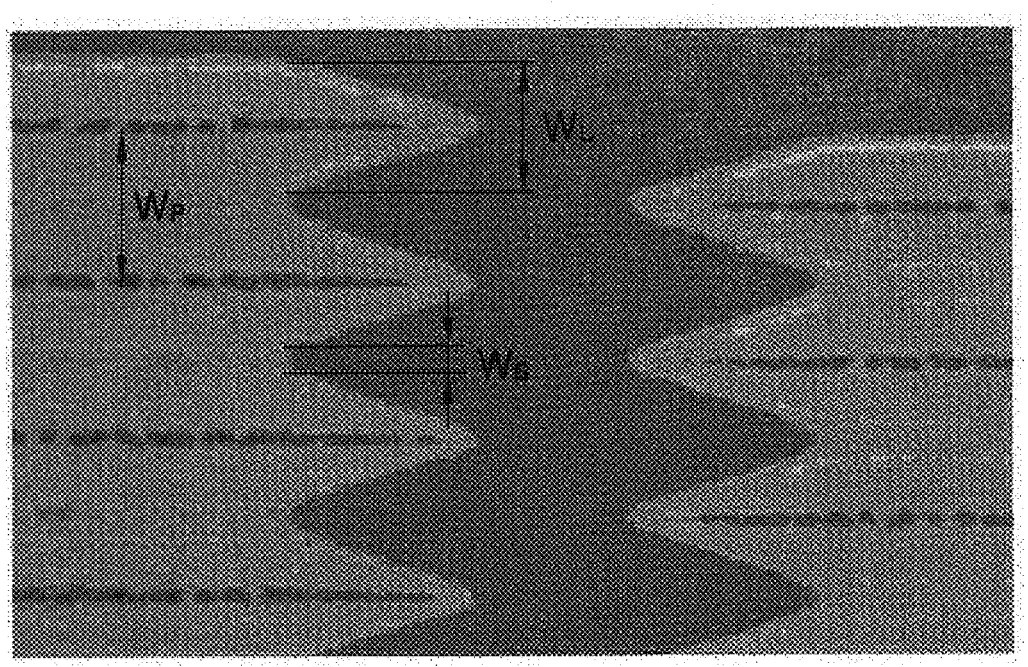
Figure 10C:
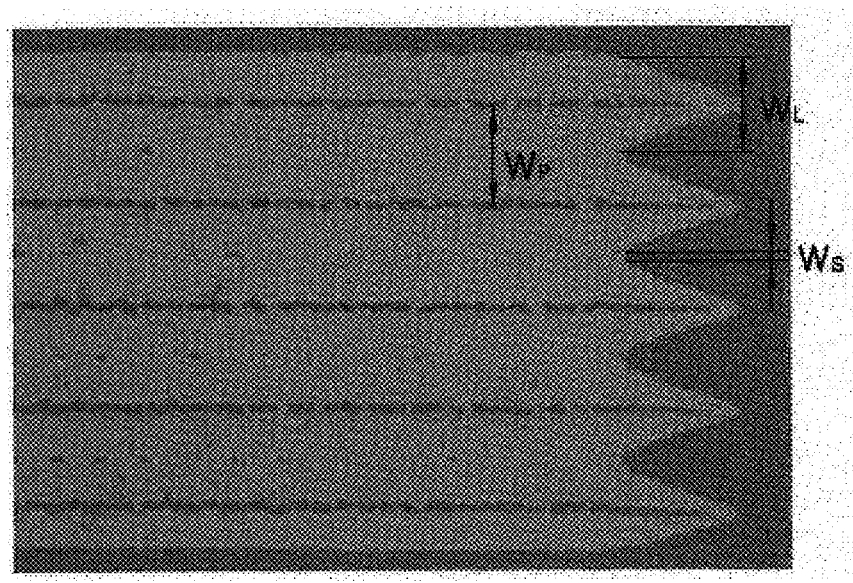

FIGS. 10a to 10c are photographs showing polysilicon grains crystallized and grown using the masks according to the prior art and according to embodiments of the present invention. As described above, the embodiment of the sequential lateral solidification apparatus used to generate the photographed polysilicon grains causes the pattern formed on the mask to be projected on a substrate at a reduced scale of 1/5.

FIG. 10A shows a polysilicon grain crystallized and grown using a conventional mask for sequential lateral solidification. In the conventional mask used for FIG. 10A, the width of the slits is 27.5 μm, the spacing between slits is 7.5 μm, and no openings that define a semi-transmission region are provided in each area between the slits.

The polysilicon grain crystallized by performing sequential lateral solidification using the aforementioned mask has the line width $W_L$ of 5.02 μm, protrusion spacing $W_P$ of 7.04 μm, and line spacing $W_S$ of 1.91 μm.

FIG. 10B shows a polysilicon grain crystallized and grown using a mask for sequential lateral solidification according to the first embodiment of the present invention. In the mask used for FIG. 10B (which includes features of the first embodiment described above), the widths of first and second slits 210 and 220 are 27.5 μm, and the spacing between adjacent first slits and between adjacent second slits is 7.5 μm. Further, two first openings 230 formed into a line slit shape are disposed in each area between adjacent first slits 210, and two second openings formed into a line slit shape are also disposed in each area between adjacent second slits 220. The widths of the first and second openings 230 and 240 are 1.5 μm.

The polysilicon grain crystallized by performing sequential lateral solidification using the aforementioned mask has a line width $W_L$ of 5.94 μm, protrusion spacing $W_P$ of 7.04 μm, and line spacing $W_S$ of 1.03 μm. Thus, it can be seen that the line width of the polysilicon grain is formed to be larger than that when a conventional mask is used. This means that the silicon crystal growth has been more extensively performed.

FIG. 10C shows a polysilicon grain crystallized and grown using a mask for sequential lateral solidification according to the fourth embodiment of the present invention. In the mask used for FIG. 10C (which includes features of the fourth embodiment described above), the widths of the first and second slits 210 and 220 are 27.5 μm, and the spacing between adjacent first slits and between adjacent second slits is 7.5 μm. Further, the first openings 230 formed into a rectangular dot slit shape are disposed in each area between the first slits 210 to be separated from one another by a predetermined interval, and the second openings formed into a rectangular dot slit shape are disposed at each area between adjacent second slits 220 to be separated from one another by a predetermined interval. The widths of the first opening 230 and the second opening 240 are 7.5 μm.

The polysilicon grain crystallized by performing sequential lateral solidification using the aforementioned mask has a line width $W_L$ of about 6.5~6.7 μm, protrusion spacing $W_P$ of 7.0 μm, and line spacing $W_S$ of 0.2~0.5 μm. Thus, it can be seen that the line width of the polysilicon grain is formed to be larger than that when a conventional mask is used. This means that the silicon crystal growth has been more extensively performed.

As described above, if the mask of the present invention is used, the line width of silicon crystal grain is increased compared to the line width produced using a conventional mask. Thus, even though shot-to-shot offset occurs in the stage along the scanning direction as a function of speed, no overlap between lines is produced. Thus, defects can be minimized.

Figure 11:
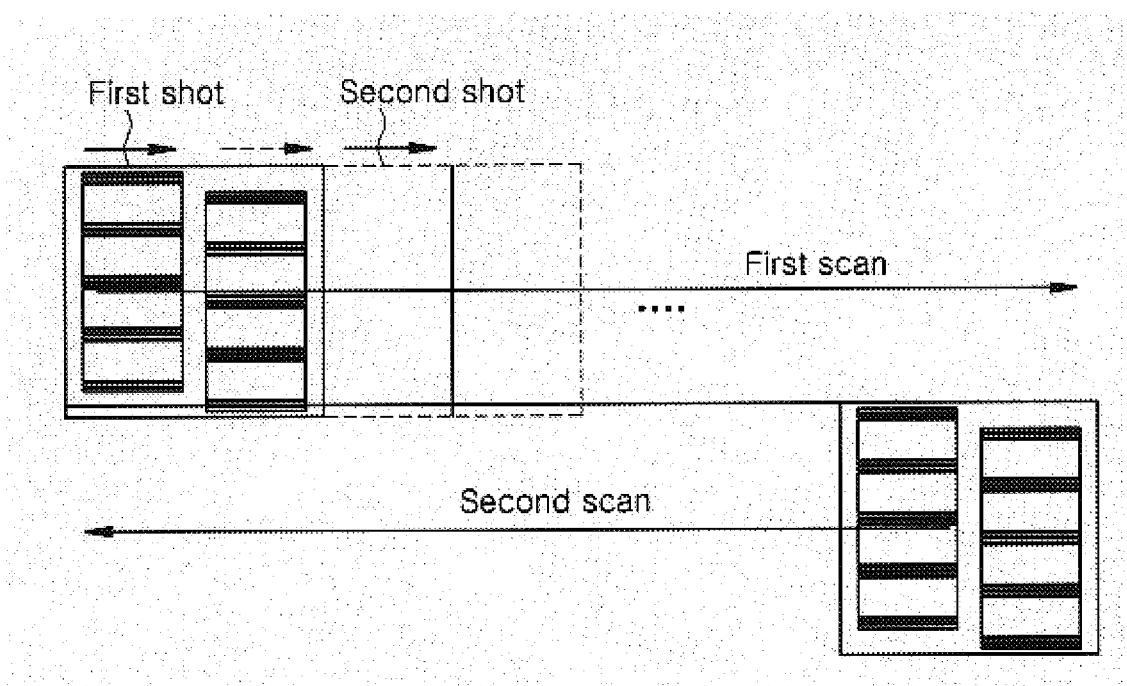
FIG. 11 is a view schematically illustrating a method of performing sequential lateral solidification using a mask for sequential lateral solidification according to the present invention.

FIG. 11 is a view schematically illustrating a method of performing sequential lateral solidification using a mask for sequential lateral solidification according to embodiments of the present invention.

Referring to FIG. 11, a substrate with an amorphous silicon thin film formed thereon is first prepared.

Then, the aforementioned mask of FIG. 5 is disposed and aligned in parallel to the substrate. In performing sequential lateral solidification, only a certain unit mask 200 is used, until the end of its usable lifetime. When the certain unit mask comes to the end of its life, it is replaced by another unit mask.

Thereafter, a laser beam is incident on the mask, then irradiated on the substrate in regions corresponding to the mask features. The laser beam is incident on the amorphous silicon thin film (during a first shot) through the first slit column including the plurality of first slits 210, the second slit column including the plurality of second slits 220, the first opening pattern including the plurality of first openings 230 and the second opening pattern including the plurality of second openings 240 if the laser beam is incident on the substrate in this way, areas of the amorphous thin film corresponding to the first and second slit columns are completely melted, and then cooled and crystallized. Areas of the amorphous thin film corresponding to the first and second opening patterns are heated and may be partially melted, to facilitate the crystallization process.

Further, while moving the stage on which the substrate is mounted, the process of irradiating the substrate using the laser beam is repeated (in second, third, fourth, . . . nth shots) to complete a first scan once the end of the substrate is reached. Thereafter, the stage descends one step and a second scan is carried out in the reverse direction. In this way, the entire area of the amorphous silicon thin film formed on the substrate is crystallized.

As noted above, although shot-to-shot offset in the scanning direction associated with stage vibration and other factors may occur, since the line width of silicon crystal grains is larger, the overlap between lines is improved. Thus, the current techniques compensate for the reduced overlap due to offset factors such as stage vibration and the like, thereby increasing the process margin.

In addition, since the size of silicon crystal grains is generally larger than the grain size obtained with prior art masks, a high performance thin film transistor can be achieved.

Although a mask for sequential lateral solidification and a method of performing sequential lateral solidification using the mask according to the present invention have been illustrated and described in connection with the preferred embodiments, the embodiments are provided for illustrative purposes, and are not intended to limit the claims in any way. It will be readily understood by those skilled in the art that various modifications and changes can be made thereto without departing from the spirit and scope of the present invention defined by the appended claims.

What is claimed is:

1. A mask for sequential lateral solidification, comprising:
a transmission region including a first slit column having a plurality of first slits separated from one another by a predetermined interval, and a second slit column having a plurality of second slits separated from one another by a predetermined interval and disposed adjacent to and offset from the first slit column, wherein the transmission region is configured to substantially completely transmit incident light therethrough; and
a semi-transmission region including a first opening pattern, the first opening pattern comprising a plurality of first openings, at least one of the plurality of first openings disposed at least partially between adjacent ones of the plurality of first slits, wherein each of the plurality of first openings are formed into an associated desired shape, and wherein the semi-transmission region further includes a second opening pattern, the second opening pattern comprising a plurality of second openings, at least one of the plurality of second openings disposed at least partially between adjacent ones of the plurality of second slits, and wherein each the plurality of second openings are formed into an associated desired shape, and wherein the semi-transmission region is configured to transmit a portion less than all of the incident light therethrough.

2. The mask as claimed in claim 1, wherein the plurality of first slits and the plurality of second slits are arranged at a predetermined angle with respect to a scanning direction, and the plurality of first openings and the plurality of second openings are inclined at the predetermined angle with respect to the scanning direction.

3. The mask as claimed in claim 1, wherein the semi-transmission region is configured such to transmit between about 30% and about 95% of the incident light.

4. The mask as claimed in claim 1, wherein the desired shape associated with each of the plurality of first openings is a line slit shape, and wherein the desired shape associated with each of the plurality of second openings is a line slit shape.

5. The mask as claimed in claim 4, wherein one or more of the plurality of first openings is disposed in an area between adjacent first slits of the plurality of first slits, and wherein one or more of the plurality of second openings are disposed in an area between adjacent second slits of the plurality of second slits.

6. The mask as claimed in claim 5, wherein one or more of the plurality of first openings are disposed adjacent upper and lower ends of the first slit column, and wherein one or more of the plurality of second openings are disposed adjacent upper and lower ends of the second slit column.

7. The mask as claimed in claim 1, wherein the plurality of first openings comprise a plurality of first openings each having a rectangular slit shape corresponding to an outer periphery of an associated one of the plurality of first slits and separated from the outer periphery of the associated first slit by a pre-determined distance, and wherein the plurality of second openings comprise a plurality of second openings having a rectangular slit shape corresponding to an outer periphery of an associated one of the plurality of second slits and separated from the outer periphery of the associated second slit by a pre-determined distance.

8. The mask as claimed in claim 7, wherein the one or more of the plurality of first openings having the rectangular slit shape includes at least two first openings disposed around a particular associated first slit and separated from one another by a predetermined distance, and wherein the one or more of the plurality of second openings having the rectangular slit shape includes at least two second openings disposed around a particular associated second slit and separated from one another by a predetermined distance.

9. The mask as claimed in claim 8, wherein the first slit column has an outer periphery with an outer peripheral shape, the second slit column has an outer periphery with an outer peripheral shape and wherein the first opening pattern further includes a first opening formed into a rectangular slit shape corresponding to the outer peripheral shape of the first slit column, and wherein the second opening pattern further includes a second opening formed into a rectangular slit shape corresponding to the outer peripheral shape of the second slit column.

10. The mask as claimed in claim 1, wherein the first opening pattern includes a plurality of first openings formed into a dot slit shape, and wherein the second opening pattern includes a plurality of second openings formed into a dot slit shape.

11. The mask as claimed in claim 10, wherein at least some of the plurality of first openings formed into the dot slit shape are disposed in an area between adjacent first slits and are separated from one another by a predetermined interval, and wherein at least some of the plurality of second openings formed into the dot slit shape are disposed in an area between adjacent second slits and are separated from one another by a predetermined interval.

12. The mask as claimed in claim 11, wherein the adjacent first slits are separated by a first slit spacing, and wherein each of the plurality of first openings formed into the dot slit shape is formed to have a width less than the first slit spacing, and wherein the adjacent second slits are separated by a second slit spacing, and wherein each of the plurality of second openings formed into the dot slit shape is formed to have a width less than the second slit spacing.

13. The mask as claimed in claim 11, wherein the adjacent first slits are separated by a first slit spacing, and wherein each of the first openings is formed to have a width substantially the same as the first slit spacing, and wherein the adjacent second slits are separated by a second slit spacing, and wherein each of the second openings is formed to have a width substantially the same as the second slit spacing.

14. The mask as claimed in claim 11, wherein each of the plurality of first openings formed into the dot slit shape is formed into at least partially curved or polygonal dot slit shape and each of the plurality of second openings formed into the dot slit shaped is formed into at least partially curved or polygonal dot slit shape.

15. The mask as claimed in claim 1, wherein each of the first slits is formed to have a width, wherein adjacent first slits are separated by a first slit spacing, and wherein the width is larger than the first slit spacing, and wherein each of the second slits is formed to have a width, wherein adjacent second slits are separated by a second slit spacing, and wherein the width is larger than the second slit spacing.

16. The mask as claimed in claim 1, wherein each of the first slits is wider than the predetermined interval measured in the direction in which the first slits are arranged, and wherein the first opening pattern is formed in the predetermined interval between first slits.

17. The mask as claimed in claim 1, wherein each of the first slits is wider than each of the first openings, width being measured in the direction in which the first slits are arranged.

18. A mask for sequential lateral solidification, comprising:
a transmission region comprising a plurality of slits, the transmission region configured to transmit substantially all light incident on the transmission region; and
a semi-transmission region comprising openings positioned adjacent the transmission region, the semi-transmission region configured to transmit a portion less than all of the light incident on the semi-transmission region.

19. The mask of claim 18, wherein the transmission region comprises a plurality of slits separated by a pre-determined interval from one another, wherein the light comprises a laser beam, and wherein the openings in the semi-transmission region comprise an opening pattern having a plurality of openings in a pre-determined shape, wherein at least one of the plurality of openings is disposed at least partially in an area between adjacent ones of the plurality of slits.

20. The mask as claimed in claim 19, wherein each of the plurality of slits is positioned at a predetermined angle with respect to a scanning direction of the mask, and each of the plurality of openings is positioned at the predetermined angle with respect to the scanning direction.

21. The mask as claimed in claim 19, wherein each of the slits is wider than the pre-determined interval measured in the direction in which the slits are arranged, and wherein the openings of the semi-transmission region are disposed in the predetermined interval.

22. The mask as claimed in claim 18, wherein the semi-transmission region is configured to transmit about 30% to about 95% of the light incident on the semi-transmission region.

23. The mask as claimed in claim 18, wherein each of the slits is wider than each of the openings, width being measured in the direction in which the slits are arranged.

* * * * *